(12) United States Patent
Harpham

(10) Patent No.: US 6,469,554 B1
(45) Date of Patent: Oct. 22, 2002

(54) CHARGE PUMP

(75) Inventor: Simon Harpham, Southampton (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 09/718,540

(22) Filed: Nov. 22, 2000

(30) Foreign Application Priority Data

Nov. 23, 1999 (GB) .............................................. 9927670

(51) Int. Cl.⁷ ................................................ H03L 7/06
(52) U.S. Cl. ...................................... 327/157; 327/112
(58) Field of Search ................................ 327/148, 147, 327/156, 157, 534, 535, 536, 537, 112

(56) References Cited

U.S. PATENT DOCUMENTS

| | | | |
|---|---|---|---|
| 4,792,705 A | 12/1988 | Ouyang et al. ............. | 327/436 |
| 4,893,030 A | 1/1990 | Shearer et al. .............. | 323/315 |
| 5,473,283 A | 12/1995 | Luich ......................... | 327/157 |
| 5,646,563 A | 7/1997 | Kuo ............................ | 327/111 |
| 5,670,869 A | 9/1997 | Weisenbach ................ | 323/313 |
| 6,104,771 A | * 8/2000 | Soda .......................... | 375/376 |
| 6,111,469 A | * 8/2000 | Adachi ....................... | 331/17 |
| 6,160,432 A | * 12/2000 | Rhee et al. .................. | 327/157 |
| 6,215,361 B1 | * 4/2001 | Lebouleux et al. .......... | 331/17 |
| 6,255,872 B1 | * 7/2001 | Harada et al. ............... | 327/157 |

FOREIGN PATENT DOCUMENTS

| | | | |
|---|---|---|---|
| EP | 0 778 510 | 6/1997 | |
| JP | 411214989 A | * 8/1999 | ........... H03L/7/093 |

* cited by examiner

*Primary Examiner*—Terry D. Cunningham
*Assistant Examiner*—Quan Tra
(74) *Attorney, Agent, or Firm*—Frommer Lawrence & Haug LLP; William S. Frommer

(57) ABSTRACT

A charge pump pair implemented by CMOS transistors comprises two charge pumps switchable to output a current of positive and negative polarity, respectively. Each charge pump comprises a current mirror including a reference current source, a logging transistor supplied with a reference current from the reference current source and a mirror transistor, the gate of the mirror transistor being connected to the gate of the logging transistor circuit to mirror an image of the reference current as the output of the charge pump. Each charge pump further include a clamp transistor switchable to selectively clamp the control input of the mirror transistor to switch the output of the mirror transistor on and off. The charge pumps are relatively scaled to equalize the rise time constants of the transient outputs of the charge pumps when switched on and the fall time constants of the transient outputs of the charge pumps when switched off. In one embodiment, the charge pumps further include a series transistor circuit connected in series with the mirror transistor circuit and switchable on and off synchronously with the clamp transistor circuit being switched on and off, the series transistor circuit when switched off providing a reverse bias voltage which assists in clamping the mirror transistor circuit off. In another embodiment, the charge pump further includes an operational amplifier of which the inverting input is connected to the line supplying the output of the mirror transistor circuit, the non-inverting input is connected to the line supplying the reference current to the logging transistor circuit and the output is connect to the control input of the logging transistor circuit. The operational amplifier reduces Early Effect.

20 Claims, 3 Drawing Sheets

CHARGE PUMP

BACKGROUND OF THE INVENTION

The present invention relates to charge pumps. A charge pump is a circuit which may be switched to output a current pulse. Charge pumps may be used in sample and hold systems, particularly in sampled data systems such as a phase-locked loop (PLL). The present invention is particularly suitable for use in a PLL employed as a local oscillator in a mobile wireless communication system such as a mobile telephone where low-power, high-speed circuits are needed.

A known circuit for a charge pump 1 is illustrated in FIG. 1. This charge pump uses a current mirror including a reference current source 2 to supply a reference current to a diode-connected logging transistor 3, the gate of which is connected to the gate of a mirror transistor 4 so that an image of the reference current flows through the mirror transistor 4.

The drain of the mirror transistor 4 is connected through a first diode 5 to the output terminal 6 and through a second diode 7 to the drain of a switching transistor 8. The gate of the switch transistor 8 is supplied with a switching signal for switching the output of the charge pump at the output terminal 6. When the switching transistor 8 is switched on (by the switching signal going low), it sinks the output current from the mirror transistor 4 of the current mirror. When the switching transistor 8 is switched off (by the switching signal going high), the mirror transistor 4 drives a negative current at the output terminal 6.

However, the charge pump 1 illustrated in FIG. 1 has a high power consumption, because even when the charge pump 1 is switched off current flows through the mirror transistor 4 and the switch transistor 8. This is undesirable, particularly in a battery-operated circuit where efficiency is important. In use, the charge pump 1 is combined with another charge pump (not shown) for supplying a positive current pulse to the output terminal 6. In this case, the circuit of charge pump 1 also suffers from poor output current matching between the two charge pumps as the voltage range at the output terminal is traversed due to Early Effect in the mirror transistors.

FIG. 2 illustrates a charge pump 9 having an improved efficiency over the charge pump 1 of FIG. 1. The charge pump 9 is again based on a current mirror including a reference current source 10 supplying a reference current to the drain of a diode-connected logging transistor 11, the gate of which is connected to the gate of a mirror transistor 12 to mirror an image of the reference current through the mirror transistor 12.

To provide switching, a series switch transistor 13 is connected in series with the mirror transistor 12 between the source of the mirror transistor 12 and the supply rail. A switching signal is supplied to the gate of the switching transistor 13 to switch the output current flowing through the mirror transistor 12. A dummy switch transistor 14 is connected in series with the logging transistor 11 to bias the logging transistor 11 by the same voltage as the mirror transistor 12 and hence allow proper operation of the current mirror.

A cascode transistor 15 is connected in series between the drain of the mirror transistor 12 and the output terminal 16. The cascode device minimises Early Effect in the mirror transistor 12 because changes in the voltage at the output terminal 16 have little effect on the voltage at the drain of the mirror transistor 12.

However, the charge pump 9 illustrated in FIG. 2 has two limitations. Firstly, the source of the mirror transistor 12 is uncontrolled during and after the on-to-off transition. Initial switch-off is fast, but becomes progressively slower as the charge on the source node of the mirror transistor 12 drains through the mirror transistor 12 into the source of the cascode transistor 15. After the current through the cascode transistor 15 and the mirror transistor 12 has been switched substantially off, any residual charge leaks onto the output terminal as a residual leakage current which is undesirable. When the charge pump 9 is used in a PLL, such leakage current manifests itself as a series of unwanted harmonic spurs related to the comparison frequency. This becomes particularly problematic at high temperatures and at low comparison frequencies.

Secondly, when the charge pump 9 of FIG. 2 is implemented in a typical CMOS technology, switching transients are injected into the surrounding circuitry via the substrate (and/or well for the PMOS devices) due to the source and drain diffusion capacitance.

Typically, a pair of charge pumps are used to output a current of positive and negative polarity, respectively. One of the charge pumps has the configuration illustrated in FIG. 1 or 2 to output a current pulse of negative polarity the other charge pump (not shown) has the same configuration but implemented using PMOS transistors instead of NMOS transistors and is connected to the output terminal to output a current of positive polarity.

Known charge pump pairs when used to control a sample data system suffer from the problem that comparison related spurii occur particularly during high-speed operation. When a charge pump pair is used in a PLL, for example, the result is that the settle time has to be increased to minimise spurii.

SUMMARY OF THE INVENTION

According to a first aspect of the present invention, there is provided a charge pump pair comprising two charge pumps switchable to output a current of positive and negative polarity, respectively, wherein the charge pumps are relatively scaled to equalise at least one of: the rise time constants of the transient outputs of the charge pumps when switched on; and the fall time constants of the transient outputs of the charge pumps when switched off.

The first aspect of the present invention serves to reduce the generation of comparison related spurii particularly for operation of high speeds. This aspect of the invention is based on an appreciation that the major contribution to comparison related spurii is the mismatch between the charge areas of the transients of the output current pulses from the two charge pumps. For example, FIG. 3 illustrates by the continuous line 17 and the dotted line 18 the magnitudes of positive and negative current pulses, respectively, when unmatched charge pumps are switched on at time t1 and switched off at time t2. As the negative current pulse has a faster rise time and a slower fall time, the charge area of the negative current pulse is less than the charge area of the positive current pulse by an amount equal the total of the shaded areas 19 and 20. However, by relatively scaling the charge pump according to the first aspect of the present invention the rise and fall times may be matched, hence equalising the charge areas of the positive and negative current pulses.

The first aspect of the present invention may be applied to a charge pump pair wherein each charge pump comprises a current mirror including a reference current source, a logging transistor circuit supplied with a reference current from the reference current source and a mirror transistor circuit, the control input of the mirror transistor circuit being connected to the control input of the logging transistor circuit to mirror an image of the reference current to the output of the mirror transistor circuit as the output of the charge pump and a clamp circuit switchable to selectively clamp the control input of the mirror transistor circuit to switch the output of the mirror transistor circuit on and off.

The logging transistor circuits and mirror transistor circuits of the two charge pumps may be formed by field-effect transistors. In that case, to equalise the rise time constants of the transients of the charge pumps when switched on the reference currents of the respective current mirrors of the two charge pumps are relatively scaled by the same ratio as the capacitances of the respective control inputs of the two charge pumps. This is because the rise time constant is governed by the charging of the control input (eg. gate) of the respective mirror transistor circuits. Consequently, the rise time constants are proportional to the ratio of the respective reference currents to the input capacitances of the respective mirror transistor circuits.

Similarly, to match the fall time constants of the transient outputs of the charge pumps when switched off the resistances of the respective clamp circuits of the two charge pumps are relatively scaled by the inverse ratio of the capacitances of the respective control inputs of the mirror transistor circuits of the two charge pumps. This is because the fall time constant is governed by the discharge of the control input (eg. gate) of the mirror transistor circuit through the clamp circuit. Consequently, the fall time constants are inversely proportional to the product of the input capacitances of the respective mirror transistor circuits and the respective resistances of the clamp circuits.

The first aspect of the present invention could be applied with the charge pump pair being implemented using any transistor technology. For example if bipolar transistors were used, the relative scaling of the mirror transistor circuits would be achieved by relatively scaling of the length of the emitter leg.

Preferably, the mirror transistor circuits of the two charge pumps are relatively scaled to have the same output current density. When the current mirrors of the two charge pumps are implemented by field-effect transistors in which the mirror transistor circuits have the same channel length, this may be achieved by relatively scaling the ratio of the channel widths of the transistors forming the respective mirror transistor circuits of the two charge pumps by the ratio of the conduction factors of the respective semiconductors used to make the transistors of the two charge pumps.

Preferably, the logging transistor circuits of the respective current mirrors of the two charge pumps are relatively scaled to equalise the magnitude of the output currents mirrored to the respective mirror transistor circuits of the two charge pumps.

Second and third aspects of the present invention relate to the circuit of a single charge pump. In particular they relate to the charge pump in a configuration comprising: a current mirror having a logging transistor circuit supplied with a reference current and a mirror transistor circuit, the control input of the mirror transistor circuit being connected to the control input of the logging transistor circuit to mirror an image of the reference current to the mirror transistor circuit as the output of the charge pump; and a clamp circuit connected to the control input of the mirror transistor circuit and switchable off and on to clamp the mirror transistor circuit on and off.

However, in such a circuit, when the clamp circuit is switched on to clamp the mirror transistor circuit off, the reference current is still flowing through the clamp transistor circuit. This causes a small voltage drop across the clamp transistor circuit equal to the product of the reference current and the drain-source resistance Rds(on) of the clamp transistor circuit when conducting. Although this voltage is small, it causes a small residual current to flow in the mirror transistor circuit in its off state.

According to the second aspect of the present invention, the charge pump additionally comprises a series transistor circuit connected in series with the mirror transistor circuit and switchable on and off synchronously with the clamp transistor circuit being switched on and off, the series transistor circuit when switched off providing a bias voltage which assists in clamping the mirror transistor circuit off. By using the series transistor circuit to provide a bias voltage which assists in clamping the mirror transistor circuit off, it is possible to prevent the residual current from flowing in the mirror transistor circuit in its off state.

Preferably, the charge pump includes a switching circuit arranged to switch the clamp transistor circuit and the mirror transistor circuit synchronously.

Desirably, the switching circuit is arranged to switch the series transistor circuit after switching the clamp transistor circuit, for example by supplying the switching signal for the clamp transistor circuit also to the series transistor circuit through a delay element, such as a NOT gate if the clamp transistor circuit is controlled by an inverted logic switching signal. Switching the series transistor circuit after the clamp transistor circuit ensures proper switching of the charge pump by the clamp transistor circuit without the generation of additional currents during the switching transients.

The reverse bias is determined by the voltage drop across the clamp transistor circuit in its non-conducting off state relative to the voltage drop across the series transistor circuit in its conducting on state.

Preferably, the charge pump further comprises a dummy transistor circuit connected in series with the logging transistor circuit to bias the logging transistor circuit by the same voltage as the series transistor circuit biases the mirror transistor circuit when switched on.

Desirably, the dummy transistor circuit is scaled relative to the clamp transistor circuit to provide a reverse bias voltage to the control input of the mirror transistor circuit for example by providing the dummy transistor circuit with a larger drain-source resistance Rds(on) than the transistor circuit.

To minimise charge depletion from the hold element connected to the output terminal (for example an external loop filter in a PLL), the charge pump output conduction must drop to zero as fast as possible to prevent the hold element voltage from changing during the hold period. This can be achieved if the control input and source of the mirror transistor circuit are clamped together during the off period. The fall time constant is proportional to the product of the output resistance of the clamp transistor circuit in its on state and the input capacitance of the control input of the mirror transistor circuit.

A further problem is that Early Effect in the mirror transistor circuit causes the output current to change as the voltage range at the output terminal is traversed. This is undesirable because it alters the magnitude of the current pulse of the charge pump at different output voltages. When a pair of charge pumps are used to output negative and positive output currents, there is poor output current matching between the two charge pumps.

According to the third aspect of the present invention, the charge pump further comprises an operational amplifier circuit of which one input is connected to the line supplying the output of the mirror transistor circuit, the other input is connected to the line supplying the reference current to the logging transistor circuit and the output is connect to the control input of the logging transistor circuit.

The operational amplifier compensates for Early Effect. The output of the operational amplifier adjusts the control input of the logging transistor circuit to force the voltage appearing on the output of the mirror transistor circuit onto the line supplying the reference current to the logging transistor circuit, through the action of the positive feedback loop. As the logging transistor circuit is current-forced and the voltage on the line supplying the reference current is controlled to equal the voltage on the output line, the mirror transistor circuit always has the same operational conditions as the logging transistor circuit, so mirrors the same image of the reference current to the output of the charge pump whatever voltage at that output.

However, this circuit can suffer from a problem after the clamp circuit is switched on to clamp the mirror transistor circuit off. This involves lowering the voltage at the control input of the mirror transistor circuit. If the control input of the logging transistor circuit is directly connected to the control input of the mirror transistor circuit, then the voltage rises on the line supplying the reference current connected to the non-inverting input of the operational amplifier. This drives the output current of the operational amplifier upwards until it reaches a maximum saturated level. Whilst this does not prevent the switching charge pump from being switched off, it requires that the clamp circuit is able to sink a large current. It also significantly raises the power consumption of the charge pump as the operational amplifier is driven hard when the charge pump is off, this being particularly undesirable in the case of for battery operation.

To deal with this problem, the charge pump preferably further comprises isolation means for isolating the line between the output of the operational amplifier and the control input of the mirror transistor circuit from the control input of the logging transistor circuit when the clamp circuit is switched to clamp the mirror transistor circuit off.

For simplicity, it is preferred that the isolation means comprises a switch circuit switched synchronously with the switching of the clamp circuit. For example the switch circuit may be formed by a transistor circuit. If a switch circuit is provided, on switching on the switch circuit, a voltage transient is generated at the control input of the logging transistor circuit which feeds into the positive feedback loop of the operational amplifier. Such a transient can cause the output of the operational amplifier to oscillate. To solve this problem, the charge pump may further comprise the switch circuit is formed by a transistor circuit.

Preferably, a buffer amplifier of which the input is connected to the line between the output of the operational amplifier and the control input of the logging transistor circuit and the output is connected to the switch circuit, which may be scaled with a replica of the reference current.

The transistor circuits in the first to third aspects of the present invention are preferably each formed by a single transistor for simplicity. However, they could take other forms, for example, a plurality of parallel-connected transistors or other more complicated configurations.

DETAILED DESCRIPTION

To allow better understanding, preferred embodiments of the present invention will now be described by way of non-limitative example with reference to the accompanying drawings.

Figure 1:
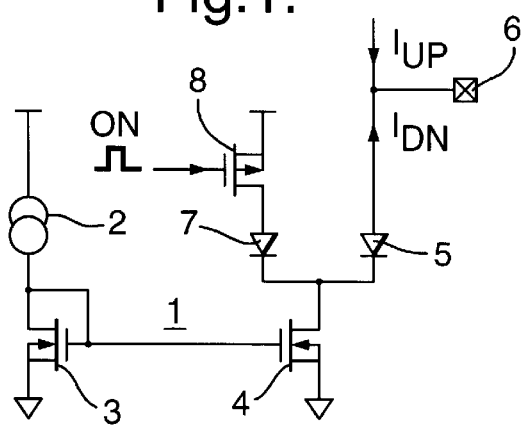
FIG. 1 shows a known configuration of a simple charge pump.
Figure 2:
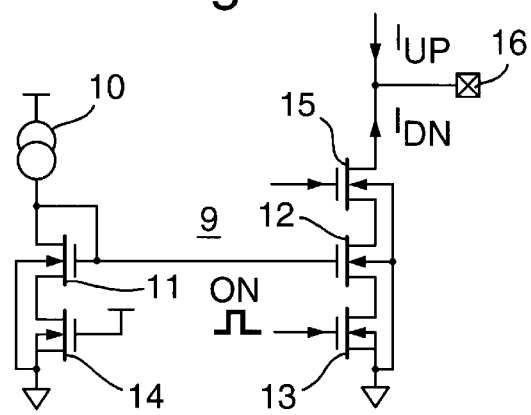
FIG. 2 shows a known configuration of a charge pump having an improved efficiency over the charge pump of FIG. 1.
Figure 3:
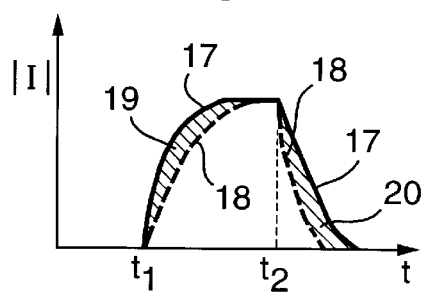
FIG. 3 illustrates the magnitude of positive and negative current pulses produced by charge pumps which are not matched.
Figure 4:
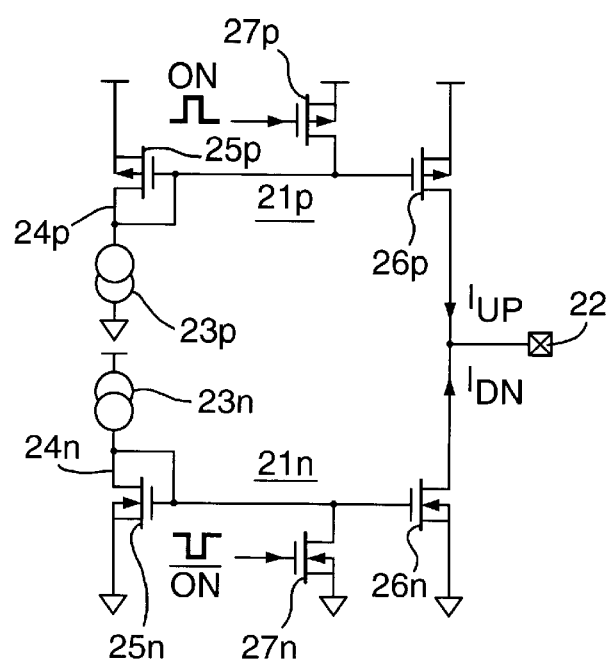
FIG. 4 shows the circuit of a charge pump pair to which the first aspect of the present invention is applied.

FIG. 4 shows a charge pump pair to which the first aspect of the present invention is applied. The charge pump pair comprises two charge pumps 21 which have the same configuration but which are formed from NMOS and PMOS transistors respectively. The reference numerals of the common elements of two charge pumps 21 are the same but distinguished by the subscripts p and n. The configuration of both charge pumps 21$p$ and 21$n$ will be described in common.

The two charge pumps 21$p$ and 21$n$ are switchable to output a current of positive and negative polarity, respectively, to an output terminal 22. Each charge pump 21 is based around a current mirror consisting of a reference current source 23 which supplies a reference current $I_{ref}$ via a line 24 to the drain of a logging transistor 25. The logging transistor 25 is diode-connected (its gate and drain are shorted).

The current mirror also includes a mirror transistor 26. The gates of the logging transistor 25 and mirror transistor 26, which constitute their control inputs, are connected together to be at the same voltage. Consequently an image of the reference current is mirrored to the drain of the mirror transistor 26 where it drives the output terminal 22.

A clamp transistor 27 is connected to the gate of the mirror transistor 26. A switching signal is supplied to the gate of the clamp transistor 27 to effect switching of the output of the charge pump 21. Of course, the switching signal applied to the clamp transistor 27$n$ of the negative current charge pump 21$n$ is logically inverted as compared to the switching signal applied to clamp transistor 27$p$ of the positive current charge pump 21$p$.

When the clamp transistor 27 is switched off, the mirror transistor 26 of the current mirror operates normally to mirror an output current to the output terminal 22 so the charge pump 21 is on.

When the clamp transistor 27 is switched on, the voltage at the gate of the mirror transistor 26 falls, switching off the mirror transistor 26 and hence switching off the current output at the output terminal 22 so the charge pump 21 is off. Therefore the clamp transistor 27 selectively switches the output of the charge pump on and off.

The clamp transistor 27 is sufficiently scaled to sink the entire reference current produced by the reference current source 23.

The two charge pumps 21n and 21p are scaled relative to each other to equalise both the rise time constants of the transient outputs of the two charge pumps 21n and 21p when switched on and also the fall time constants of the transient outputs of the charge pumps when switched off. Of course for a negative current pulse the rise and fall times refer to rises and falls in the magnitude of the current, not the absolute level.

The rise time constant of each charge pump is controlled by the charging of the gate node of the mirror transistor 26 on switching the clamp transistor 27 off. Accordingly, the rise time constant is proportional to the reference current $I_{ref}$ divided by the input capacitance C of the gate of the mirror transistor 26. Therefore, to equalise the rise time constants of the two charge pumps 21p and 21n, the reference currents $I_{refp}$ and $I_{refn}$ are relatively scaled by the ratio of the capacitances Cp and Cn of the gates of the mirror transistors 26p and 26n as in the equation:

$$\frac{I_{refp}}{I_{refn}} = \frac{Cp}{Cn} \qquad (1)$$

To be more accurate, one should note that the rise time constant is inversely proportional to the total capacitance of the gates of the logging transistor 25 and the mirror transistor 26 whereby the quantities Cp and Cn in equation (1) actually represent this total capacitance. However, the charge pump is normally implemented by scaling the mirror transistor 26 relative to the logging transistor 25 by a large factor x, typically 10 or more, because the mirror transistor is the output device. Thus the capacitance of the mirror transistor 26 is significantly larger than the capacitance of the logging transistor 25 which can therefore be ignored so that the capacitance Cp and Cn in equation (1) are approximately the capacitances of the respective mirror transistors 26p and 26n.

The capacitance C of each mirror transistor 26 is proportional to the product of the channel width W and the channel length L of the semiconductor channel forming the mirror transistor 26. Normally the corresponding transistors of the two charge pumps are designed to have the same length L, in which case the capacitance C is proportional solely to the width W of the mirror transistor 26. In this case, it will be seen that the reference currents $I_{refp}$ and $I_{refn}$ of the two charge pump can be relatively scaled by the ratio of the channel widths Wp and Wn of the mirror transistors 26p and 26n according to the equation:

$$\frac{I_{refp}}{I_{refn}} = \frac{Wp}{Wn} \qquad (2)$$

For a field effect transistor, the drain current Id is given by the equation:

$$Id = B \cdot \frac{W}{L} \cdot Ve^2 \qquad (3)$$

where Ve is the effective voltage equal to the gate-source voltage Vgs minus a threshold voltage (or pinch-off voltage) Vt; W and L are the channel width and the channel length respectively of the semiconductor channel of the transistor; and B is the conduction factor which is a constant specific to the type of semiconductor dependent on its constituents and method of manufacture.

The effective voltage Ve is chosen to be the point of inflection in the compliance range of the output of the charge pump 21 (typically 0.25V).

The conduction factor Bp of a PMOS transistor is usually about one third the conduction factor Bn of a NMOS transistors for a given manufacturing process. Accordingly, to ensure that the output current density of the mirror transistor 21p equals the current density of the mirror transistor 21n and given that the channel lengths Lp and Ln of the mirror transistors 26p and 26n are the same, then the widths Wp and Wn of the mirror transistors 26p and 26n are relatively scaled by the inverse of the ratio of the conduction factors Bp and Bn as in the following equation:

$$\frac{Wp}{Wn} = \frac{Bn}{Bp} \qquad (4)$$

Accordingly, as can be seen from equations (2) and (4), the reference currents $I_{refp}$ and $I_{refn}$ n are also scaled by the inverse of the conduction factors Bp and Bn, as in the following equation:

$$\frac{I_{refp}}{I_{refn}} = \frac{Bn}{Bp} \qquad (5)$$

In general, if the mirror transistors are scaled as discussed above, the compliance range of the two charge pumps 21p and 21n at the output terminal 22 is asymmetric because the drain-source voltage Vds(sat) of the two mirror transistors 26p and 26n (given by equation (3) above) are not equal. To restore the equality the channel widths W'p and W'n of the logging transistors are scaled to equalise the output currents of the two mirror transistors. As the mirror transistor 26 and the logging transistor 25 have the same effective voltage Ve in each charge pump 21, from equation (3) it can be seen that the channel widths W'p and W'n are relatively scaled by the product of the ratio of the reference currents $I_{refp}$ and $I_{refn}$ and the ratio of the channel widths Wp and Wn of the mirror transistor circuits 26p and 26n (assuming the normal design consideration that the channel length of the two logging transistors 24p and 24n is the same), according to the equation:

$$\frac{W'p}{W'n} = \frac{I_{refp}}{I_{refn}} \cdot \frac{Wp}{Wn} \qquad (6)$$

As the current densities of the two mirror transistors 26p and 26n are the same this also has the effect of equalising the effective voltages Ve of the two current mirrors 21p and 21n so the symmetrical compliance range is restored.

Combining equations (4), (5) and (6), the relative scaling of the channel widths W'p and W'n of the logging transistors can be related to the conduction factors Bp and Bn of the p and n type semiconductors by the equation:

$$\frac{W'p}{W'n} = \left(\frac{Bn}{Bp}\right)^2 \quad (7)$$

The fall time constants of the output current pulses of each charge pump 21 is controlled by the decay of the voltage on the gate of the mirror transistor 26 when the clamp transistor 27 is switched on. Therefore, the fall time constant is inversely proportional to the product of the drain-source resistance Rds(on) of the clamp transistor 27 when fully conducting and the input capacitance of the gate of the mirror transistor 26 (or more accurately the total of the input capacitances of the gate of the logging transistor 25 and the mirror transistor 26, but the latter can normally be ignored as discussed above). Therefore, to equalise the fall time constants, the resistances Rds(on)p and Rds(on)n of the respective clamp devices 27p and 27n of the two charge pumps 21p and 21n are relatively scaled by the inverse ratio of the capacitances Cp and Cn according to the equation:

$$\frac{Rds(on)p}{Rds(on)n} = \frac{Cn}{Cp} \quad (8)$$

As discussed above, the input capacitance C of each mirror transistor 26 is proportional to the product of channel width W and the channel length L of the semiconductor channel of the mirror transistor 26. Thus with the normal design constraint that the channel lengths Lp and Ln of the two mirror transistors 26p and 26n are the same and equating the output current densities of the two mirror transistors 26p and 26n as in equation (4), it can be seen that the resistances of the clamp devices should be scaled by the inverse ratio of the conduction factors of the semiconductors in the respective mirror transistors 26p and 26n, according to the equation:

$$\frac{Rds(on)p}{Rds(on)n} = \frac{Bp}{Bn} \quad (9)$$

The clamp transistors 27 are easily scaled by forming them to have a channel width W and channel length L which gives them the appropriate drain-source resistance Rds(on) when conducting.

Figure 5:
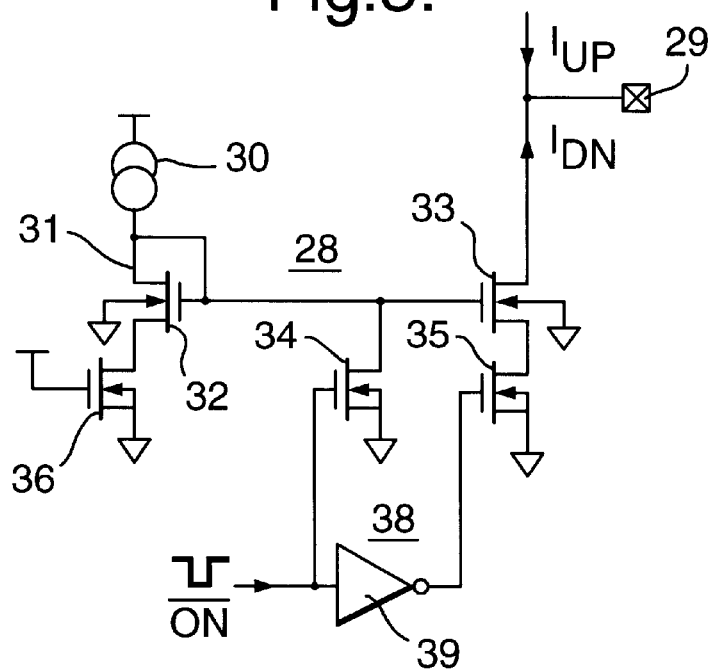
FIG. 5 shows the circuit of a charge pump which is an embodiment of the second aspect of the present invention and to which the first aspect of the present invention is applied.

FIG. 5 illustrates a charge pump which embodies the second aspect of the present invention. The charge pump 28 is switchable to output a current pulse of negative polarity to an output terminal 29. In use the charge pump 28 is combined with another charge pump (not shown) switchable to output a current pulse of positive polarity to the output terminal 29 and having the same configuration but formed from PMOS transistors whereas charge pump 28 is formed from NMOS transistors.

The charge pump 28 is based around a current mirror consisting of a reference current source 30 which supplies a reference current $I_{ref}$ on a line 31 to the drain of a diode-connected logging transistor 22. The current mirror also includes a mirror transistor 33. The gates of the logging transistor 31 and the mirror transistor 33, which constitute their control inputs, are connected together to be at the same voltage. Consequently an image of the reference current is mirrored to the drain of the mirror transistor 33 where it drives the output terminal 29.

A clamp transistor 34 is connected to the gates of the mirror transistor 33. A series transistor 35 is connected to the source of the mirror transistor 33 in series with the mirror transistor 33. A dummy switch transistor 36 is connected to the source of the logging transistor 32. The gate of the dummy switch 36 is biassed to hold the dummy switch on. This biases the logging transistor 32 by the same voltage as the series transistor 35 biases the mirror transistor 33 when the series transistor 35 is switched on.

A switching circuit 38 supplies a switching signal directly to the gate of the clamp transistor 34. The switching circuit 38 also supplies the switching signal to the gate of the series transistor 35 through a NOT gate 39 for logical inversion. The NOT gate 39 acts as a delay element so that the switching signal is supplied to the series transistor 35 after being supplied to the clamp transistor 34.

When clamp transistor 34 is off, the mirror transistor 33 operates normally to mirror an image of the reference current to the output terminal 29. When the clamp transistor 34 is switched on, the voltage at the gate of the mirror transistor 33 falls, switching off the mirror transistor 33 and hence switching off the current output at the output terminal 29. Accordingly the clamp transistor 34 is sufficiently scaled to sink the entire reference current produced by the reference current source 30.

After the clamp transistor 34 is switched on, the series transistor 35 is switched off. Accordingly, the series transistor 35 biases the source of the mirror transistor 33 to assist in clamping the mirror transistor 33 off. Preferably, a reverse bias voltage is generated. The actual reverse bias voltage is determined by the voltage drop across the series transistor 35 in its conducting state and the clamp transistor 34 in its non-conducting state.

The series transistor 35 is scaled to have a larger drain-source resistance Rds(on) when fully conducting than the clamp transistor 34 to ensure a moderate reverse bias. Assuming the lengths of the semiconductor channels of the series transistor 35 and clamp transistor 34 are the same, this may be done by making the ratio of the width of the channel of the series transistor 35 to the width of the channel of the clamp transistor 34 greater than the ratio of the magnitude of the output current pulse to the magnitude of the reference current.

Unfortunately the provision of the series switch 35 reduces the output compliance range of the charge pump because it moves the voltage level at each of the nodes of the mirror transistor 33 further away from the supply rail.

When the clamp transistor 34 is switched off, the voltage at the gate of the mirror transistor 33 rises. After that, the series transistor 35 is switched on, causing the voltage at the source of the mirror transistor 33 to fall and allowing the mirror transistor 33 to mirror an image of the reference current to the output terminal 29.

The fact that the NOT gate 39 delays the switching signal applied to the series switch 35 is useful to limit the generation of spurious current flow which would occur if the series switch 35 were switched off before or at the same time as switching on the clamp transistor 34. If the series transistor 35 was switched off before the clamp transistor 34 was switched on, then when the clamp transistor 34 was subsequently switched on, the source of the mirror transistor 33 would be uncontrolled due to the impulse at the source of mirror transistor 33 due to gate-source capacitance feedthrough. Thus the lowering of the voltage at the gate of the mirror transistor 33 would drive the voltage at the source of the mirror transistor 33 downwards, below the voltage of the supply rail because of the input capacitance at the gate of the mirror transistor 33 which is typically larger than the capacitance of the switch transistor 35. This would cause an uncontrolled current to flow at the output terminal 29.

Also, if the series transistor 35 was switched on before the clamp transistor 34 was switched off, then this would initially cause the voltage at the source of the mirror transistor 33 to fall as the series transistor 35 tried to drive a current flow. Subsequently when the clamp transistor 34 was turned off causing the voltage at the gate of the mirror transistor 33 to rise, the reduced voltage at the source of the mirror transistor 33 would produce an increased gate-source voltage across the mirror transistor 33 thereby slowing the switching.

When the charge pump 28 is combined with another charge pump (not shown) to create a charge pump pair, the two charge pumps are scaled in the same manner as the charge pump pair of FIG. 4 to implement the first aspect of the present invention.

Figure 6:
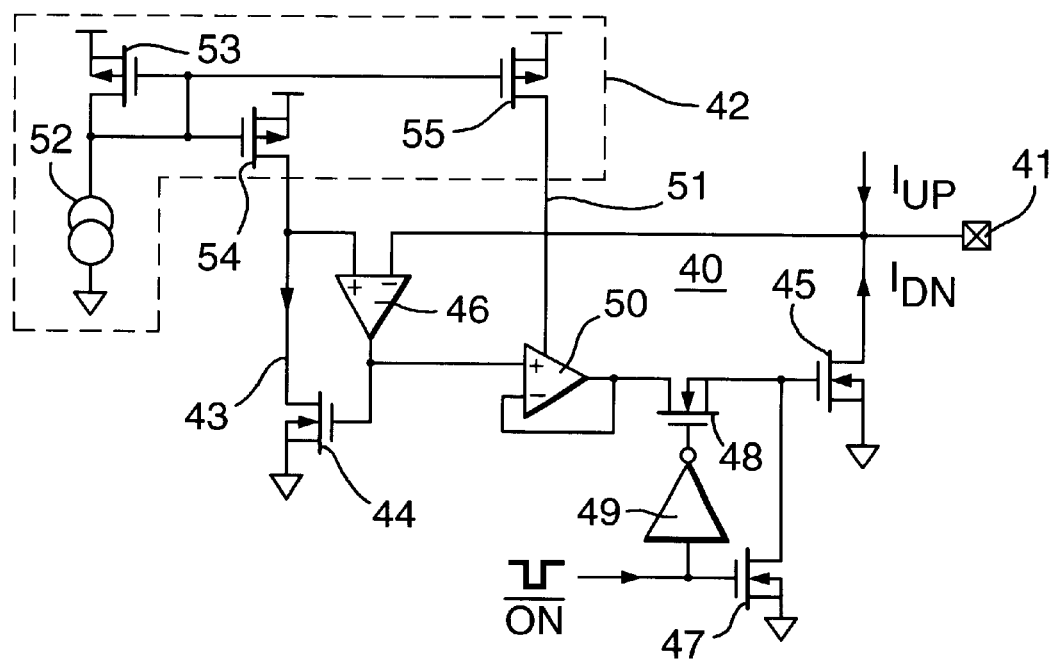
FIG. 6 shows the circuit of a charge pump which is an embodiment of the third aspect of the present invention and to which the first aspect of the present invention is applied.

FIG. 6 illustrates a charge pump 40 which embodies the third aspect of the present invention and to which the first aspect of the invention is applied. In use the charge pump 40 is combined with another charge pump (not shown) switchable to output a current of positive polarity to the output terminal 41 and having the same configuration but formed from PMOS transistors whereas charge pump 40 is formed from NMOS transistors.

The charge pump 40 is switchable to output a current of negative polarity to an output terminal 41. The charge pump 40 is based upon a current mirror consisting of a reference current source 42 which supplies a reference current $I_{ref}$ on a line 43 to the drain of a logging transistor 44. The current mirror also includes a mirror transistor 45. The gate of the logging transistor 44 is connected indirectly (via circuit elements described in detail below) to the gate of the mirror transistor 45. As the gates of the logging transistor 44 and the mirror transistor 45, which constitute their control inputs, are at the same voltage, the reference current supplied on line 43 is mirrored to the drain of the mirror transistor 45 where it drives the output terminal 41.

The charge pump 40 also includes an operational amplifier 46 arranged to provide Early Effect compensation. The inverting input of the operational amplifier 46 is connected to the output terminal 41 to sense the charge pump output voltage. The non-inverting input of the operational amplifier 46 is connected to the line 43 supplying the reference current to the logging transistor 44 to monitor of the drain of the logging transistor 44 which is current forced. The output of the operational amplifier 46 is connected to the gate of the logging transistor 44.

The operational amplifier 46 senses the output of the voltage of the output terminal 41 and adjusts the voltage at the gate of the logging transistor 44 until the voltage at the drain of the logging transistor 44 connected to the non-inverting input is at the level of the output voltage. Thus the drain of the logging transistor 44 is voltage-regulated by the action of the operational amplifier, as well as being current forced by the reference current on line 43. This makes the operational conditions of the logging transistor 44 completely deterministic. When the output voltage changes, the positive feedback loop of the operational amplifier adjusts the gate voltage of the logging transistor 44 by an amount which maintains the reference current through the logging transistor 44 whilst adjusting the voltage of the drain of the logging transistor 44 to equal the output voltage. Thus the logging transistor 44 and the mirror transistor 45 have both their gates and their drains at the same voltage levels, so the mirror transistor 45 continues to mirror the same image of the reference current regardless of changes in the output voltage. In this way, the operational amplifier 46 compensates the mirror transistor 45 for Early Effect.

The negative feedback loop around the mirror transistor 45 and the inverting input of the operational amplifier 46 is effectively open due to the virtual earth at the output terminal 41 under transient conditions.

A clamp transistor 47 is connected to the gate of the mirror transistor 45. An inverted logical switching signal is supplied to the gate of the clamp transistor 47 to effect switching of the output of the charge pump 40. When the clamp transistor 47 is switched off, the mirror transistor 45 of the current mirror operates normally to drive an output current at the output terminal 41. When the clamp transistor 47 is switched on, the voltage at the gate of the mirror transistor 45 falls, switching off the mirror transistor 45 and hence switching off the current output at the output terminal 41. Therefore, the clamp transistor 47 selectively switches the output of the charge pump on and off. The clamp transistor 47 is sufficiently scaled to sink the entire reference current supplied to its drain.

An isolation transistor 48 is connected by its source to the gate of the mirror transistor 45 and the drain of the clamp transistor 47 and by its drain to the line between the gate of the logging transistor 44 and the output of the operational amplifier 46 (via a buffer amplifier 50 described in detail below). The gate of the isolation transistor 48 is controlled by the same switching signal as the clamp transistor 47 but after being passed through a NOT gate 49 to obtain a non-inverted logic signal. The isolation transistor 48 thereby acts as a switch circuit which is switched synchronously with the clamp transistor 47 so as to open on the isolation transistor 48 and the clamp transistor 47 clamps the output current off.

The isolation transistor 48 serves to isolate the gate of the logging transistor 44 (and the output of the operational amplifier 46 forming part of the positive feedback loop of the operational amplifier 46) from the action of the clamp transistor 47 clamping the gate of the mirror transistor 45. Otherwise, if the output of the operational amplifier 46 was connected directly to the clamp transistor 47, then clamping of the mirror transistor 45 would cause current to be drawn from the operational amplifier 46 up to its maximum saturated level. This would cause an undesirably high power consumption during the off period of the charge pump.

A buffer amplifier 50 is connected between the isolation transistor 48 and the gate of the logging transistor 44. The non-inverting input of the buffer amplifier 50 is connected to the gate of the logging transistor 44 and the output of the operational amplifier 46. The output of the buffer amplifier 50 is connected to the isolation transistor 48 and also fed back to the inverting input of the buffer amplifier 50 so that it acts as a voltage-follower. The buffer amplifier 50 protects the gate of the logging transistor 44 from the voltage transients generated by switching of the isolation transistor 48. Otherwise if the isolation transistor 48 was connected directly to the gate of the logging transistor 44, such transients would be fed into the positive feedback loop of the operational amplifier 46 undesirably creating oscillations in the output of the operational amplifier 46.

The buffer amplifier 46 is an operational transconductance amplifier. It is scaled by a replica of the reference current supplied from the reference current source 42 on line 51.

The reference current source 42 has the following structure in order to generate the reference current and its replica. The reference current source 42 is based on an internal current mirror formed by an internal current source 52 supplying an internal reference current to a diode-connected internal logging transistor 53. The gate of the internal logging transistor 53 is connected to the gate of an internal mirror transistor 54 to form a current mirror. The internal mirror transistor 54 mirrors an image of the internal reference current from this drain onto line 43 as the reference current supplied to the logging transistor 44.

A secondary mirror transistor 55 also has its gate connected to the gate of the internal logging transistor 53, in parallel with the internal mirror transistor 54. The secondary mirror transistor 55 supplies an image of the internal reference current from its drain onto the line 51 to bias the buffer amplifier 50. The internal mirror transistor 54 and the secondary mirror transistor 55 are identically scaled so that the current supplied on line 51 to the buffer amplifier 50 is an identical replica of the reference current supplied on line 43 to the logging transistor 44.

When the charge pump 40 is combined with another charge pump (not shown) to create a charge pump pair, the two charge pumps are scaled in the same manner as the charge pump pair of FIG. 4 to implement the first aspect of the present invention. The buffer amplifier 50 now drives charging of the gate of the mirror transistor 45 but due to the scaling of the buffer amplifier 50 by a replica of the reference current, the relative scalings described above for the charge pump pair of FIG. 4 are appropriate also for the charge pump 40 of FIG. 6.

Optionally, the second aspect of the present invention may be applied to the charge pump 40 by including a series transistor in series with the mirror transistor 45 together with an appropriate switching circuit and a dummy switch in series with the logging transistor 44, as described in detail for the charge pump 28 of FIG. 5.

In all the embodiments, the image current mirrored to the drain of the mirror transistor need not be identical in magnitude to the reference current. In practical implementations the image current will be scaled relative to the reference current by a factor x controlled by the relative scaling of the mirror transistor and the logging transistor. Typically the factor x will be 10 or greater so that the mirror transistor can effectively drive the output terminal.

The charge pumps illustrated in FIGS. 4 to 6 are implemented using CMOS transistors but other types of transistors could be used, such as other field effect transistors or bipolar transistors.

Figure 7:
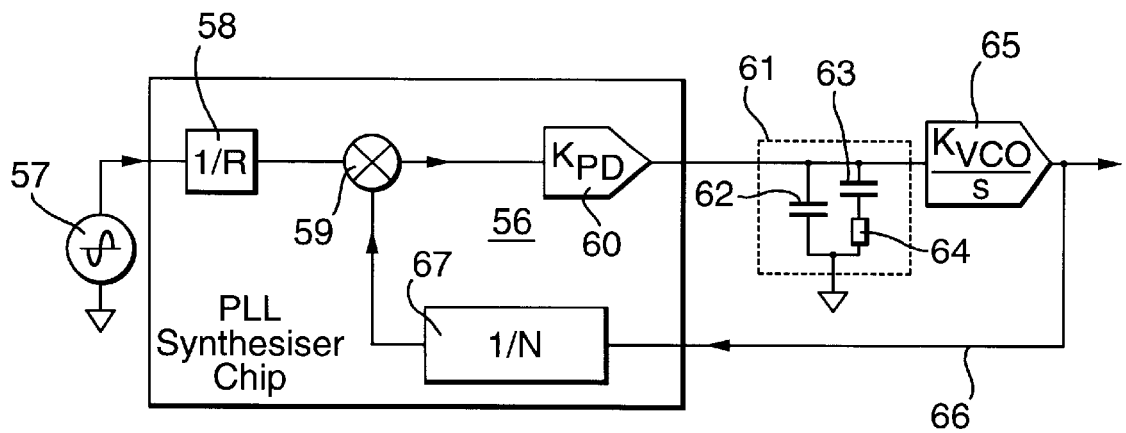
FIG. 7 illustrates a PLL in which charge pumps according to the present invention may be used.

The charge pumps of any of FIGS. 4 to 6 may be used in a PLL, for example the single-loop integer-N PLL 56 illustrated in FIG. 7. The PLL 56 includes a reference source 57 which generates a reference signal which is frequency divided by a reference frequency divider 58. The frequency-divided reference signal is supplied to a phase comparator 59 which compares the phase difference between the frequency divided reference signal and a feedback signal.

The phase comparator 59 controls a charge pump pair 60 to conduct for a time equal to the phase difference. The charge pump pair 60 includes two charge pumps constructed as illustrated in any of FIGS. 4 to 6. One charge pump of the charge pump pair 60 is controlled to output a negative current pulse for a negative phase difference and the other charge pump of the charge pump pair 60 is controlled to output a positive current pulse for a positive phase difference. This scaling may be reversed for some implementations, for example where the gain $K_{vco}$ of the voltage controlled oscillator 60 (described below) is negative.

The charge pump pair 60 pumps a passive loop filter 61 including an integration capacitor 62 of capacitance $C_1$ and a shunt arrangement of a damping capacitor 63 of capacitance $C_2$ and a damping resistor 64 of resistance R so that total reactance of the shunt arrangement is $(R+(1/sC_2))$. The loop filter 61 filters the output of the charge pump pair 60 and outputs a control voltage which is supplied to a voltage controlled oscillator 65 which outputs the output signal of the PLL 56 having a frequency controlled by the control voltage output from the loop filter 61.

The output signal is also supplied through a feedback loop 66 including a feedback frequency divider 67 which frequency divides the output signal before supply to the phase comparator as the feedback signal.

Figure 8:
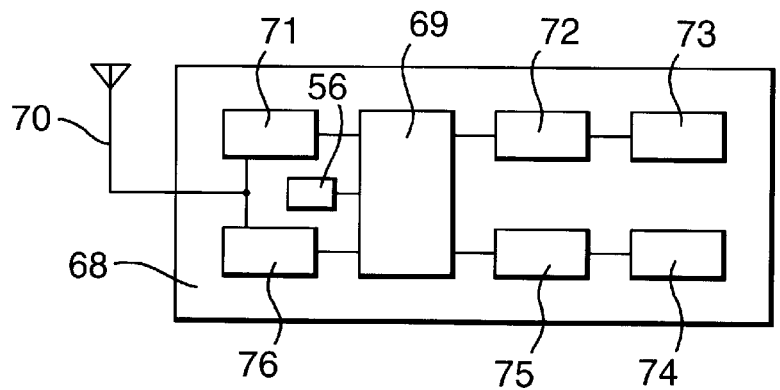
FIG. 8 illustrates a mobile telephone employing the PLL of FIG. 7 as a local oscillator.

The PLL 56 may be employed as a local oscillator in a mobile communications product such as the mobile telephone 68 illustrated in FIG. 8. The output of the PLL 56 is fed to a mixer 69 where it is used as a local oscillator signal to frequency convert the reception signal received from an antenna 70 through a reception circuit 71. The converted reception signal is supplied to a demodulator circuit 72 to generate an audio signal which is supplied to a speaker 73. Similarly, an audio signal received by a microphone 74 is modulated by a modulator circuit 75 and supplied to the mixer 69 which frequency converts it using the output of the PLL 56. This creates a transmission signal which is supplied to a transmitter circuit 76 for transmission by the antenna 70.

What is claimed is:

1. A charge pump switchable to output a current pulse, comprising:

a current mirror having a logging transistor circuit supplied with a reference current, and a mirror transistor circuit, the control input of the mirror transistor circuit being connected to the control input of the logging transistor circuit to mirror an image of the reference current to the mirror transistor circuit as the output of the charge pump;

a clamp transistor circuit connected to the control input of the mirror transistor circuit and switchable off and on to clamp the mirror transistor circuit on and off; and a series transistor circuit connected in series with the mirror transistor circuit and switchable on and off synchronously with the clamp transistor circuit being switched on and off, the series transistor circuit when switched off providing a bias voltage which assists in clamping the mirror transistor circuit off.

2. A charge pump according to claim 1, further comprising a switching circuit arranged to switch the clamp transistor circuit and the mirror transistor circuit synchronously.

3. A charge pump according to claim 2, wherein the switching circuit is arranged to switch the series transistor circuit after switching the clamp transistor circuit.

4. A charge pump according to claim 3, wherein the switching circuit supplies a switching signal to the clamp transistor circuit and supplies the switching signal to the series transistor circuit through a delay element.

5. A charge pump according to claim 4, wherein the delay element is an inverting logic gate.

6. A charge pump according to claim 1, wherein the clamp transistor circuit is scaled to sink the reference current.

7. A charge pump according to claim 1, further comprising a dummy transistor circuit connected in series with the logging transistor circuit to bias the logging transistor circuit by the same voltage as the series transistor circuit biases the mirror transistor circuit when switched on.

8. A charge pump according to claim 7, wherein the series transistor circuit is scaled relative to the clamp transistor circuit to provide a reverse bias voltage to the control input of the mirror transistor circuit.

9. A charge pump according to claim 1, wherein the transistor circuits are formed by field-effect transistors.

10. A charge pump switchable to output a current pulse, comprising:

a current mirror having a logging transistor circuit supplied with a reference current, and a mirror transistor circuit, the control input of the mirror transistor circuit being connected to the control input of the logging transistor circuit to mirror an image of the reference current to the mirror transistor circuit as the output of the charge pump;

a clamp circuit connected to the control input of the mirror transistor circuit and switchable off and on to clamp the mirror transistor circuit on and off; and an operational amplifier circuit of which one input is connected to the line supplying the output of the mirror transistor circuit, the other input is connected to the line supplying the reference current to the logging transistor circuit and the output is connect to the control input of the logging transistor circuit.

11. A charge pump according to claim 10, wherein the operational amplifier circuit comprises a single operational amplifier of which the inverting input is connected to the line supplying the output of the mirror transistor circuit and the non-inverting input is connected to the line supplying the reference current to the logging transistor circuit.

12. A charge pump according to claim 10, further comprising isolation means for isolating the line between the output of the operational amplifier and the control input of the mirror transistor circuit from the control input of the logging transistor circuit when the clamp circuit is switched to clamp the mirror transistor circuit off.

13. A charge pump according to claim 12, wherein the isolation means comprises a switch circuit switched synchronously with the switching of the clamp circuit.

14. A charge pump according to claim 13, wherein the switch circuit is formed by a transistor circuit.

15. A charge pump according to claim 13, further comprising a buffer amplifier of which the input is connected to the line between the output of the operational amplifier circuit and the control input of the logging transistor circuit and the output is connected to the switch circuit.

16. A charge pump according to claim 15, wherein the buffer amplifier is an operational transconductance amplifier.

17. A charge pump according to claim 16, wherein the operational transconductance amplifier is scaled by a replica of the reference current.

18. A charge pump according to claim 10, wherein the transistor circuits are formed from field-effect transistors.

19. A charge pump according to claim 1, employed in a phase-locked loop.

20. A charge pump according to claim 1, employed in a phase-locked loop of a mobile telephone.

* * * * *